United States Patent [19]

Aker

[11] 3,891,946

[45] June 24, 1975

[54] VARIABLE FREQUENCY OSCILLATOR INCLUDING ACTIVE BAND-PASS FILTER WITH POSITIVE FEEDBACK

[75] Inventor: John L. Aker, Chanute, Kans.

[73] Assignee: Kustom Electronics, Inc., Chanute, Kans.

[22] Filed: Mar. 20, 1974

[21] Appl. No.: 452,709

Related U.S. Application Data

[62] Division of Ser. No. 222,524, Feb. 1, 1972, Pat. No. 3,812,278.

[52] U.S. Cl. .............................. 331/108 D; 331/135

[51] Int. Cl. .............................................. H03b 5/20

[58] Field of Search ................. 331/108 D, 135–142

[56] References Cited

UNITED STATES PATENTS 3,708,762 1/1973 Nilsson .......................... 331/135 X 3,806,832 4/1974 Channing et al. ........... 331/108 D X

*Primary Examiner*—Siegfried H. Grimm

*Attorney, Agent, or Firm*—Lowe, Kokjer, & Kircher

[57] ABSTRACT

A virtually distortionless low frequency audio oscillator generates a sine wave output which may be varied in frequency by a single passive element. The oscillator comprises an active band-pass filter, the center frequency of which is determined by a variable resistive element, an inverter for generating positive feedback, and a diode bridge clipper circuit, which limits the steady state oscillator amplitude. Regeneration is accomplished when the square wave clipper output is fed back to the band-pass filter input, and distortion is reduced by the limiting action of the clipper circuit which avoids overdriving of the band-pass filter.

2 Claims, 1 Drawing Figure

PATENTED JUN 24 1975 3,891,946
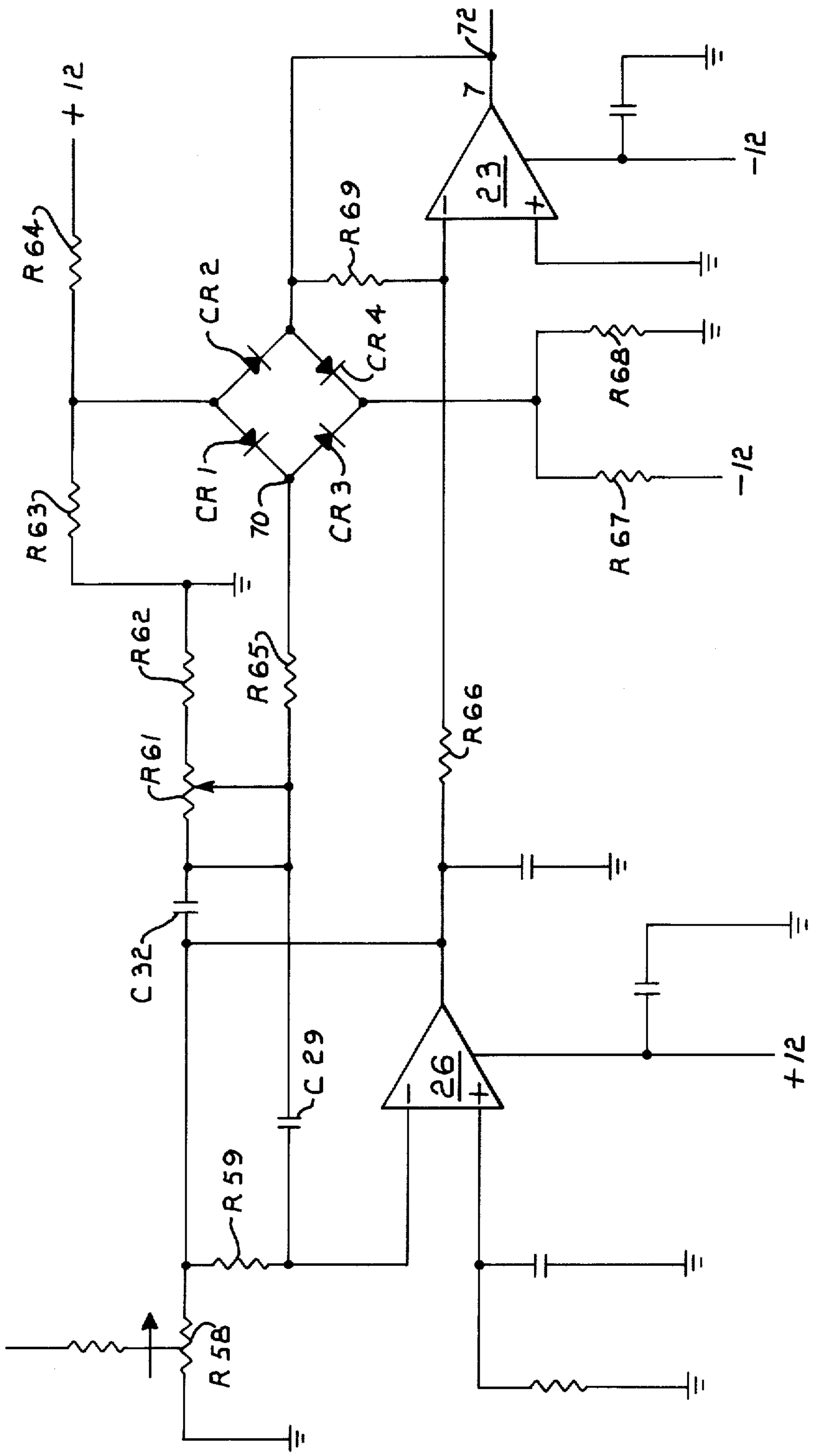

VARIABLE FREQUENCY OSCILLATOR INCLUDING ACTIVE BAND-PASS FILTER WITH POSITIVE FEEDBACK

BACKGROUND AND SUMMARY OF THE INVENTION

This is a divisional application which sets forth an invention first disclosed in conjunction with my application, Ser. No. 222,524, filed Feb. 1, 1972, entitled "Special Effects Amplifier for Electrical Musical Instruments, " now U.S. Pat. No. 3,812,278.

This invention relates generally to sinusoidal oscillation. More particularly to low distortion, variable frequency audio oscillators which are suitable for use in conjunction with "tremelo" or "vibrato" circuitry of the type used in electronic musical instrument amplifiers.

An object of my invention is to provide an extremely reliable and economical audio oscillator for tremelo or vibrato circuits which may be easily varied in frequency by the adjustment of a single element. Accordingly, an active band-pass filter is utilized to provide the loop gain necessary for oscillation, and the center frequency of the band-pass filter is determined by a single resistive element. Adjustment of this resistor varies the oscillator output frequency within limits of approximately 3–18 Hz., depending upon the desired tremelo or vibrato rate. In prior art devices more than a single element often had to be adjusted to vary the tremelo or vibrato rate. For example, in Wien bridge oscillator circuits a pair of resistors functioning in a tandem had to be simultaneously adjusted. The tracking and alignment problems which are characteristic of such prior art devices have been eliminated by the present invention.

It is a further object of this invention to provide a variable frequency audio oscillator of extremely low distortion. The present device utilizes diode clippers in the feedback circuit to limit the amplitude of the feedback signal presented to the band-pass filter inputs. The steady state oscillator amplitude is thereby limited and distortion is reduced because the possibility of overloading is minimized.

It is another object of this invention to economically provide controlled limiting for an audio oscillator. The feedback path in the present invention comprises a diode bridge which provides limiting by its inherent clipping action. The necessity for additional limiting or amplitude regulation circuitry has thus been avoided.

It is a further object of this invention to provide a low distortion variable frequency audio oscillator that is voltage independent. It is a feature of this invention that intermodulation by-products are reduced as is the tendency to overload the circuit so that unwanted distortion is virtually eliminated.

It is a still futher object of this invention to provide a low distortion oscillator of the character described above which has a center frequency controlled by a single variable element in order to further insure the economic production of a very low distortion sine wave.

Other and further objects of the invention, together with the features of novelty appurtenant thereto, will appear in the course of the following description.

DETAILED DESCRIPTION OF THE INVENTION

The accompanying drawing, which forms a part of the specification and is to be read in conjunction therewith, is a schematic diagram of the improved oscillator circuit constructed in accordance with the teachings of this invention.

The oscillator comprises an integrated circuit amplifier 26, which in conjunction with resistors R-59, R-65, R-61 and R-62 and capacitors C-29 and C-32, forms an active band-pass filter having a gain determined by R-65 and R-59 with a variable center frequency determined primarily by R-61. Variation of R-61 produces an output frequency having a value within the range of approximately 3–18 Hz. Within this frequency range distortion will be approximately 0.25 percent or less.

The band-pass filter is followed by an inverter 23 (and resistors R-66 and R-69) having a unity gain at 180° phase shift. The net phase shift in the positive feed back loop is thus 360° at the center frequency of the band-pass filter. Oscillation is insured since the small signal loop gain through the active band-pass filter is slightly greater than unity.

The steady state amplitude of the oscillator is limited or determined by the clipper circuit comprised of diodes CR-1, CR-2, CR-3 and CR-4, and the associated resistors R-67, R-68, R-63 and R-64.

As mentioned above, the output of phase inverter 23 is a low distortion sine wave, and when presented to the above described clipper network, a symmetrically clipped sine wave results at node 70, and it is delivered to the band-pass filter via R-65. Due to the symmetrical action of the clipper circuit, the harmonic multiples generated by clipping will be odd in nature and the primary distortion component seen by the band pass filter will be a third harmonic of the frequency to which it is tuned. The clipped sine wave, when passed through the filter circuit which includes IC-26, will be regenerated again because the filter circuit will pass with low attenuation only the fundamental frequency component of the clipped sinusoid. The clipper limits the amplitude of the feed back signal to a level consistent with linear operation of IC amplifier 26. A very low distortion sinusoidal output is thereby economically produced at more than a fixed frequency. Further, there is no requirement of tandem potentiometers or other linkage mechanisms because resistor 61 alone need be varied to alter the center frequency of the filter pass band, in order to control the oscillator frequency.

The sinusoidal output of the oscillator appears at node 72. Another output, which is 180 degrees out of phase from the signal appearing at node 72 appears across R-58. Where, for example, it is desirable to have two sinusoidal outputs differing in phase by 180 degrees, the circuitry disclosed is ideal. Either of these outputs are ideally suited for use in conjunction with the tremelo or vibrato modulators utilized by electronic musical amplifiers.

From the foregoing, it will be seen that this invention is one well adapted to attain all of the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth, or shown in the accompanying drawing, is to be interpreted as illustrative and not in a limiting sense.

Having thus described my invention I claim:

1. A low distortion sinusoidal oscillator circuit comprising:

an active inverting band pass filter having an input and an output, inverter means for generating a positive feedback signal, said inverter means having an output and an input interconnected with said inverting band-pass filter output, a feedback loop having an input and an output, the feedback loop input interconnected with said inverter means output and said feedback loop output interconnected with said active band-pass filter input, said feedback loop having a means for limiting the amplitude of said positive feedback signal, the limiting means comprising a clipping circuit interconnected between said inverter means output and said filter means input, and a means for adjusting the center frequency of said active band-pass filter, the adjusting means consisting of a single resistive element.

2. The combination as in claim 1 including means for causing said clipping circuit to operate symmetrically.

* * * * *